US005675310A

United States Patent [19]

Wojnarowski et al.

[11] Patent Number: 5,675,310

[45] Date of Patent: Oct. 7, 1997

[54] THIN FILM RESISTORS ON ORGANIC SURFACES

[75] Inventors: Robert John Wojnarowski, Ballston Lake; James Wilson Rose, Guilderland; Kyung Wook Paik, Clifton Park; Michael Gdula, Knox, all of N.Y.

[73] Assignee: General Electric Company, Schenectady, N.Y.

[21] Appl. No.: 349,228

[22] Filed: Dec. 5, 1994

[51] Int. Cl.$^6$ .......... H01C 1/012; H01L 27/00

[52] U.S. Cl. .......... 338/309; 338/312; 29/621; 437/60; 437/918

[58] Field of Search .......... 338/22 R, 22 SD, 338/307–309, 312; 437/60, 918; 148/DIG. 136; 29/621

[56] References Cited

U.S. PATENT DOCUMENTS

| | | | |
|---|---|---|---|
| 3,781,610 | 12/1973 | Bodway | 338/309 |
| 3,918,019 | 11/1975 | Nunn | 338/42 |
| 4,020,222 | 4/1977 | Kausche et al. | 338/308 |
| 4,042,479 | 8/1977 | Yamazaki et al. | 338/308 X |
| 4,087,778 | 5/1978 | Merz et al. | 338/309 |
| 4,200,970 | 5/1980 | Schonberger | 338/22 SD X |
| 4,267,634 | 5/1981 | Wellard | 338/307 |
| 4,418,474 | 12/1983 | Barnett | 29/612 |
| 4,734,709 | 3/1988 | Kobayashi et al. | 338/308 X |
| 4,780,790 | 10/1988 | Takimoto et al. | 361/323 |
| 4,783,695 | 11/1988 | Eichelberger et al. | 257/668 |
| 4,801,469 | 1/1989 | Norwood | 338/308 X |
| 5,043,295 | 8/1991 | Ruggerio et al. | 437/47 |
| 5,084,420 | 1/1992 | Tsai | 437/228 |
| 5,266,529 | 11/1993 | Lau et al. | 437/228 |
| 5,323,138 | 6/1994 | Oki et al. | 338/307 |
| 5,353,498 | 10/1994 | Fillion et al. | 29/840 |
| 5,420,063 | 5/1995 | Maghsoudnia et al. | 437/60 |
| 5,468,672 | 11/1995 | Rosvold | 437/60 |
| 5,469,131 | 11/1995 | Takahashi et al. | 338/307 X |
| 5,496,762 | 3/1996 | Sandhu et al. | 437/60 |
| 5,547,896 | 8/1996 | Linn et al. | 437/60 |
| 5,586,006 | 12/1996 | Seyama et al. | 361/719 |
| 5,602,059 | 2/1997 | Horiuchi et al. | 437/209 |

OTHER PUBLICATIONS

U.S. Patent Application "Application of Thin Film Electronic Components on Organic and Inorganic Surfaces" by Robert J. Wojnarowski, et al, filed Dec. 5, 1994.

"Response Surface Methodology", by William G. Hunter, Quality Control Handbook, Section 28, pp. 28-1–28-12.

"Lightly Trimming the Hybrids" by A. Elshabini-Riad, et al, 1993 IEEE, Circuits and Devices, pp. 30–34.

"Electrical Trimming of Ion-Beam-Sputtered Polysilicon Resistors by High Current Pulses" by Soumen Das, et al, IEEE Transactions on Electron Devices, vol. 41, No. 8, Aug. 1994, pp. 1429–1434.

"Improvement of Laser Trimmed Film Resistor Stability By Selection of Optimal Trim Paths" by Jaime Ramfrez-Angulo, et al, IEEE pp. 2188–2191.

"A Technology for High Density Mounting Utilizing Polymeric Multilayer Substrate" by M. Takeuchi, et al, IEEE/CHMT 1989 Japan IEMT Symposium, pp. 136–140.

*Primary Examiner*—Teresa J. Walberg
*Assistant Examiner*—Ralphael Valencia
*Attorney, Agent, or Firm*—Ann M. Agosti; Marvin Snyder

[57] ABSTRACT

A method for fabricating a thin film resistor comprises applying a tantalum nitride layer over a dielectric layer, applying a metallization layer over the tantalum nitride layer, and patterning the metallization layer with a first portion of the metallization layer situated apart from a second portion of the metallization layer and both the first and second portions being at least partially situated on the tantalum nitride layer. In one embodiment, after patterning the metallization layer, the resistance value between the first and second portions of the metallization layer is determined and compared to a predetermined resistance value, and at least one of the first and second portions is trimmed to obtain a modified resistance value between the first and second portions that is closer to the predetermined resistance value than the determined resistance value.

9 Claims, 3 Drawing Sheets

18 26 28 24 23 22 14 12 34 34 33 32 10 16

THIN FILM RESISTORS ON ORGANIC SURFACES

This invention was made with Government support under Government Contract No. 93F146400-000. The Government has certain rights in this invention.

GROSS-REFERENCE TO RELATED APPLICATION

This application is related to the following co-pending application which is commonly assigned and is incorporated herein by reference: R. J. Wojnarowski et al., "Application of Thin Film Electronic Components on Organic and Inorganic Surfaces," U.S. application Ser. No. 08/349,278; filed concurrently herewith.

BACKGROUND Of THE INVENTION

1. Field of the Invention

This invention relates generally to resistors and, more particularly, to thin film resistors for use in multi-chip modules.

2. Description of the Related Art

Multi chip modules (MGMs) require micro-miniature parts to achieve their greatest potential for size and performance reduction. Many MGMs require terminating resistors that can be placed in close proximity to the actual point of the electrical run termination. Furthermore, micro-analog, high speed digital, and microwave circuits often need resistors to trim their gains, terminate their runs, and bias their thresholds. Conventional chip resistors are too large, occupy too much substrate space, and limit routing options. Additionally, resistors are generally limited to a single plane.

SUMMARY OF THE INVENTION

Accordingly, an object of the present invention is to provide a resistor fabrication process compatible with the polymer multi-chip module (MCM) fabrication technologies, including high density interconnection processes.

Anther object is to provide thin film resistors on multiple layers of an MCM.

These objects are achieved by depositing and patterning a thin film resistor material comprising tantalum nitride on polymer surfaces. The resistor fabrication process is compatible with HDI applications, as well as most polymer based MCM processes and printed circuit (PC) board technologies.

Briefly, according to a preferred embodiment of the invention, a method for fabricating a thin film resistor comprises applying a tantalum nitride layer over a dielectric layer, applying a metallization layer over the tantalum nitride layer, and patterning the metallization layer with a first portion of the metallization layer situated apart from a second portion of the metallization layer and both the first and second portions being at least partially situated on the tantalum nitride layer.

In one embodiment, after patterning the metallization layer, the resistance value between the first and second portions of the metallization layer is determined and compared to a predetermined resistance value, and at least one of the first and second portions is trimmed to obtain a modified resistance value between the first and second portions that is closer to the predetermined resistance value than the determined resistance value.

According to another preferred embodiment of the invention, a thin film resistor comprises a dielectric layer, a tantalum nitride layer over the dielectric layer, and a patterned metallization layer over the tantalum nitride layer. A first portion of the metallization layer is situated apart from a second portion of the metallization layer with both the first and second portions being at least partially situated on the tantalum nitride layer. Preferably, the tantalum nitride layer comprises a hexagonal closed packed $Ta_2N$ structure and the dielectric layer comprises a polyimide.

According to another preferred embodiment of the invention a circuit module comprises a substrate having a chip well with a circuit chip having chip pads situated in the chip well, a dielectric layer over the substrate and circuit chip having vias to the chip pads, and a tantalum nitride layer comprising a hexagonal closed packed $Ta_2N$ structure situated over the dielectric layer. A patterned metallization layer extends over the tantalum nitride layer and into selected ones of the vias with a first portion of the metallization layer situated apart from a second portion of the metallization layer and with both the first and second portions being at least partially situated on the tantalum nitride layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
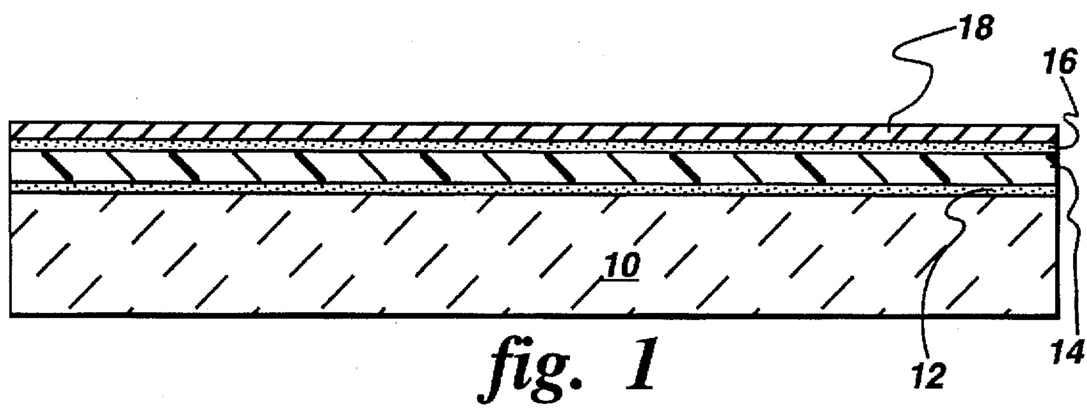
FIG. 1 is a sectional side view of resistor material and metallization of the present invention prior to patterning.

FIG. 1 is a sectional side view of resistor material 16 and metallization 18 of the present invention overlying a dielectric layer 14 which itself overlies a substrate 10. Substrate 10 may comprise any suitable structure material. In one embodiment, the substrate comprises a ceramic such as alumina. Dielectric layer 14 preferably comprises a polymer film having a low coefficient of thermal expansion (CTE) such as KAPTON-E™ polyimide (13 ppm/°C. (parts per million per degree centigrade)—KAPTON is a trademark of E. I. duPont de Nemours & Co.) or UPILEX-S™ polyimide (12 ppm/°C.—UPILEX is a trademark of UBE Industries, Ltd.). A low CTE is useful because many polymers have CTEs greater than 20 ppm/°C., whereas the preferred resistor material ($Ta_2N$) has a CTE which can be 10 ppm/°C. or less. When materials having a CTE much greater than the CTE of the resistor material are used, a stress is generated at the interface which can result in a crack of the film of resistor material.

Dielectric layer 14 is preferably laminated to substrate 10 using a substrate adhesive 12 comprising any appropriate adhesive material such as, for example, ULTEM™ polyetherimide (ULTEM is a registered trademark of General Electric Co.).

Resistor material 16 is applied over the dielectric layer. In the preferred embodiment, the resistor material comprises tantalum nitride. Tantalum nitride can be a BCC (body centered cubic structure) beta-tantalum, a FCC (face centered cubic structure) TaN, or a $Ta_2N$ HCP (hexagonal close packed structure). Preferably the tantalum nitride resistor material is of the $Ta_2N$ phase of the material in its most stable hexagonal closed packed form, although there can also be mixtures of these phases which can be used for higher resistance values, depending upon the sputtering deposition conditions. TaN FCC material, for example, has a high resistance value, but is more variable than $Ta_2N$ HCP material and has more drift. Tantalum nitride resistors are reactively deposited by a sputtering operation using mixed gases, such as nitrogen and argon at predetermined ratios, pressures, and plasma power settings. Tantalum nitride resistors are advantageous because they are more stable at high temperatures than the more commonly used nichrome (NiCr) resistors, and they are compatible with high density interconnect techniques such as those described in Eichelberger et al., U.S. Pat. No. 4,783,695, issued Nov. 8, 1988.

Prior to the deposition of resistor material, the surface of dielectric layer 14 should be free of scratches and holes which cause defective resistor sites. This can be facilitated by cleaning the substrate material and applying a plasma RIE (reactive ion etch) for adhesion promotion.

The substrate is preferably placed on a heat sink block and mechanically held with screws to limit the heat that is built up during the sputtering operations. The pressure is then reduced in a vacuum chamber to less than $1\times10^{-6}$ torr for a length of time sufficient to eliminate outgassing and moisture. The dielectric layer is backsputtered with argon at 400 watts of RF (radio frequency) energy for approximately one minute. The DC (direct current) magnetron sputterer containing the tantalum sputtering target pre-sputters the sputtering area for one minute for cleaning and conditioning. Then the substrate is positioned under the sputtering target, and a layer of 1500 to 3000 Å of tantalum nitride is reactively applied by DC (direct current) sputtering using a predetermined mixture of $N_2$ and Ar gasses.

If desired, after the resistor material is applied, the resistor material can be patterned with a tantalum etch, for example, to limit the presence of the resistor material to the vicinity of the fabrication location of the thin film resistor.

A metallization layer 18 is applied over the resistor material. The metallization layer may comprise any electrically conductive material that can withstand the fabrication processes and the applications of the specific MCM. In one embodiment, immediately after the sputtering of the resistor material, a 1000 Å layer of titanium is sputtered, followed by a 3000 Å layer of copper. Then the substrate is removed from the vacuum chamber deposition system and is placed on an electroplating cathode. Immersion in an acid copper sulfate electroplating bath without current for about 15 seconds can be used as a preclean and adhesion step. The copper is then electroplated to 4 microns thickness. The metallization layer is rinsed, dried, and positioned back in the sputtering system for the application of 1000 Å of titanium.

After deposition, the resistance of the resistor material increases a small percentage (approximately seven percent) initially and then becomes stable. The resistors can be stabilized by being heated in a vacuum or inert gas oven at temperatures of approximately 200° C. to 250° C. for 10–30 minutes to limit a tantalum oxide formation at the surface. The stabilization is done so as not to oxidize the copper layer. IR (infrared) heating can also be provided using an $N_2$ gas purge, for example.

In one embodiment of the invention, dielectric layer 14 comprises a polymer having filler material to enhance thermal performance of the interconnections or other MCM layers. The filler material preferably comprises either stone or mineral. In one embodiment, KAPTON polyimide with alumina or mica filler material (sold by the E. I. duPont de Nemours & Co. Specialty Products Division in Wilmington, Del.) is used as the dielectric layer. The filled materials provide the potential for MCMs having higher power densities than can be accomplished with KAPTON polyimide alone. Mica-filled KAPTON polyimide available from E. I. duPont de Nemours & Co. under stock number. 200xA-m25 and is 25% filled. The alumina-filled KAPTON polyimide material is available from E. I duPont de Nemours & Co. under stock order number 100 MT for 1 mil thickness and stock order number 150 MT for 1.5 mil thickness.

Figure 2:
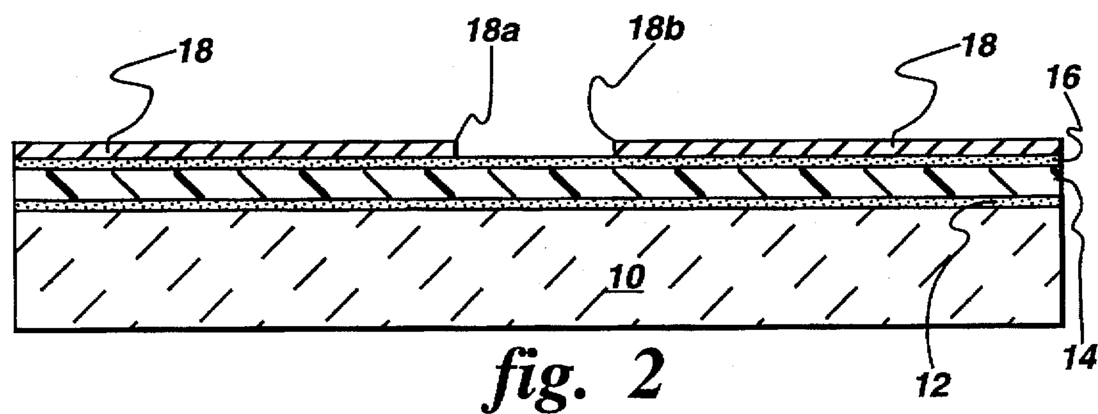
FIG. 2 is a view similar to that of FIG. 1 after metallization patterning has occurred.

FIG. 2 is a view similar to that of FIG. 1 after metallization patterning has occurred. A first portion **18*a* of the metallization layer is situated apart from a second portion 18*b* of the metallization layer with both the first and second portions being at least partially situated on the tantalum nitride layer. Metallization layer 18** can be patterned, for example, by applying a photoresist (not shown) and using laser lithography to expose the desired pattern. The metallization layer is then etched using conventional processes. If the metallization layer includes a plurality of individual metals, each of the metals can be etched separately. For example, the top titanium layer can be etched using a conventional titanium etch, a ferric chloride copper etch can be used to pattern the copper, and a second titanium removal step can be used to remove the lower titanium layer. Furthermore, if desired, a separate etch step can performed to pattern the resistor material.

Figure 3:
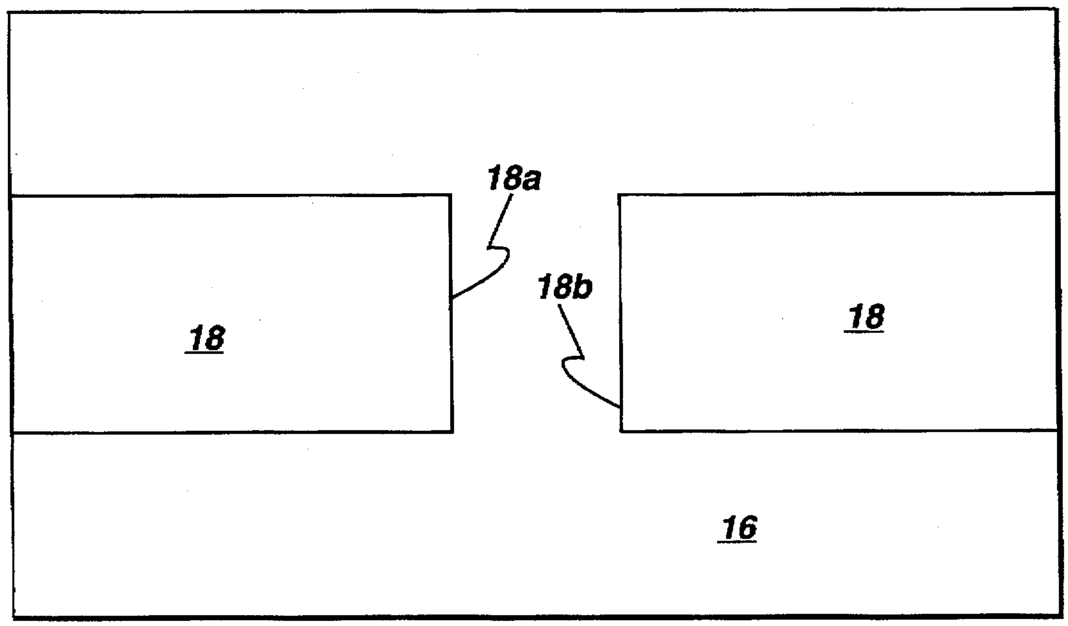
FIG. 3 is a top view of the resistor material and metallization shown in FIG. 2.

FIG. 3 is a top view of the resistor material and metallization shown in FIG. 2. In an optional embodiment, to compensate for the variable nature of the resistance of the resistor layer, the metallization layer is patterned so as to leave less space (and thus less resistance) between the first and second portions of the metallization layer than will likely be appropriate for the final resistor. This initial patterning technique allows the resistance to be measured directly or otherwise determined, and the metallization layer to be further trimmed accordingly to increase the resistance.

Figure 4:
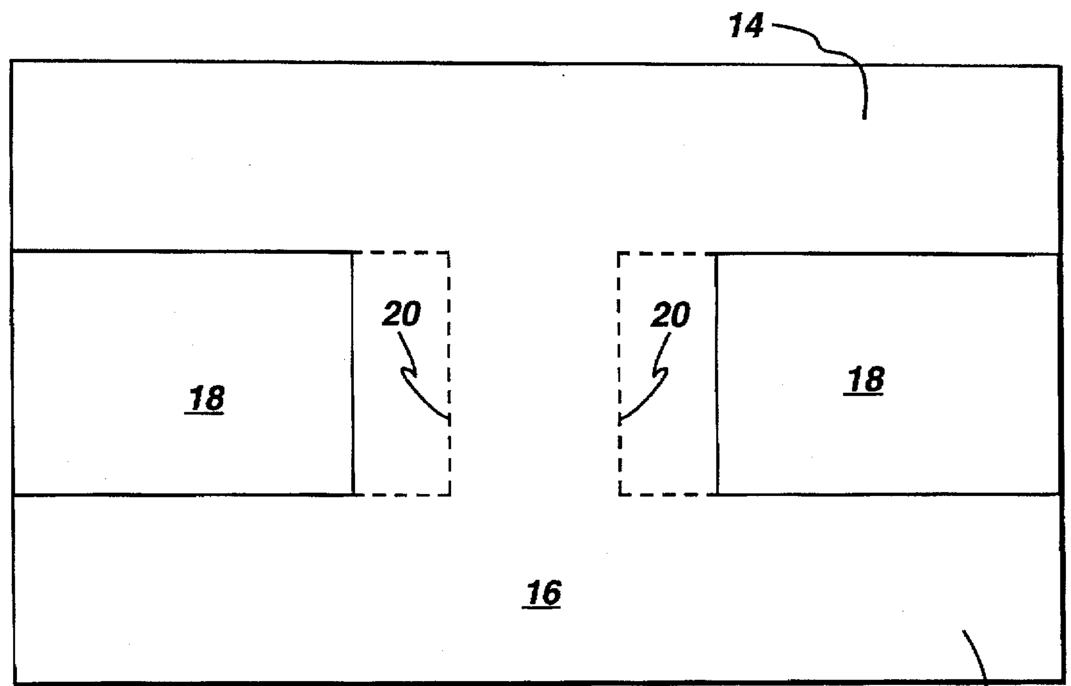
FIG. 4 is a view similar to that of FIG. 3 showing the metallization after trimming.

FIG. 4 is a view similar to that of FIG. 3 showing the metallization and resistor material after trimming, with dashed lines 20 representing the original locations of the metallization layer. The trimming can be performed in the same manner as discussed with respect to the metallization patterning in FIG. 2.

Any one of a number of different methods can be used to estimate the resistance of the resistor. For example, probes (not shown) can be situated on metallization layer 18 to measure resistance.

Figure 5:
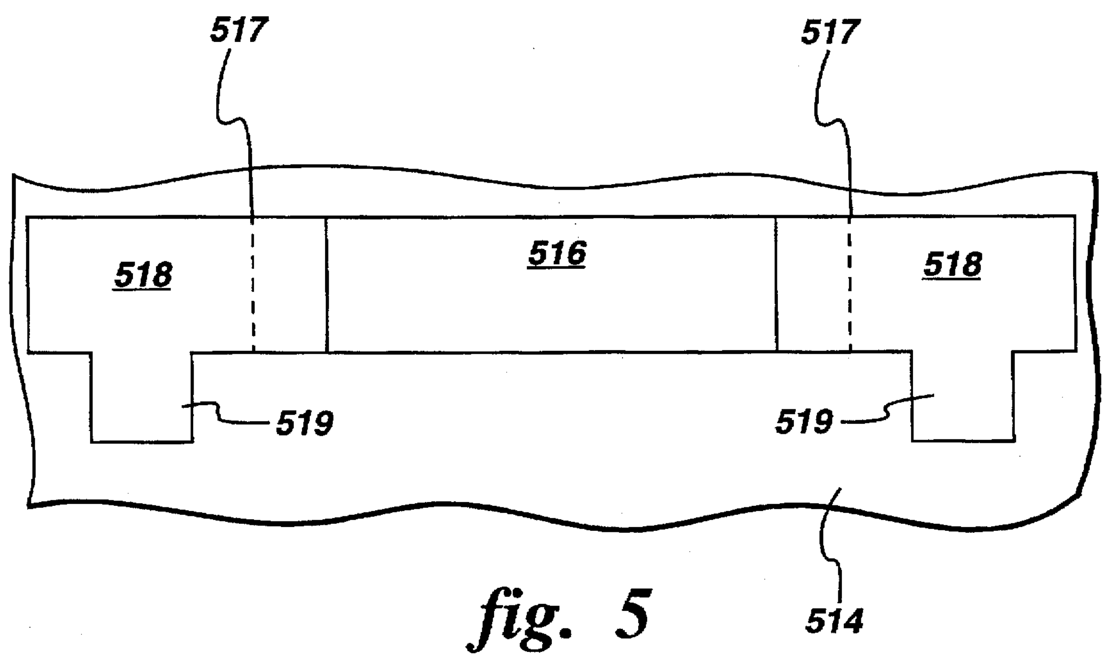
FIG. 5 is a top view showing removable tabs for probing the metallization.
Figure 6:
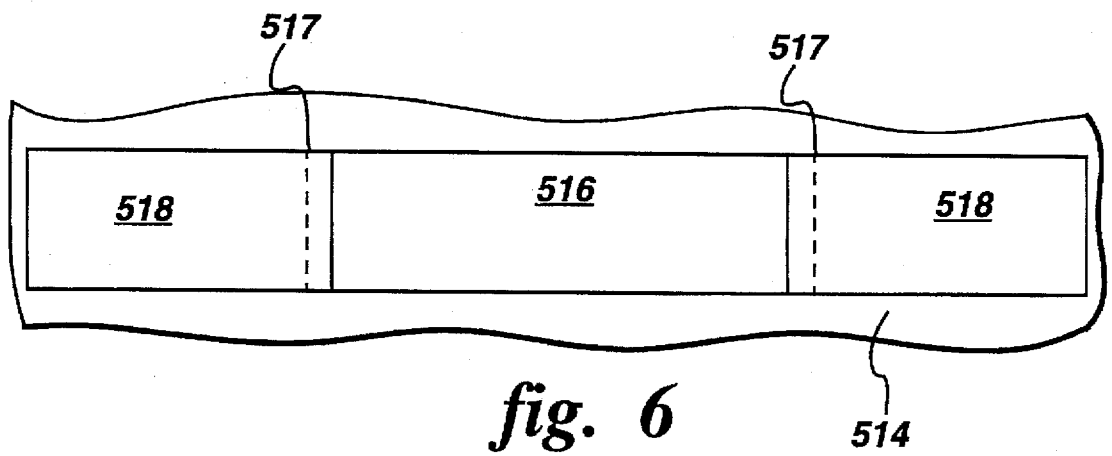
FIG. 6 is a view similar to that of FIG. 5, showing the metallization layer after trimming.

In another embodiment, as shown in the top view of FIG. 5, removable tabs 519 are patterned simultaneously with metallization layer 518. These tabs are useful for measuring the resistance value without damaging the resistor metallization, and resistors may be stabilized by the use of these tabs by applying electrical power to the resistor material through the tabs to raise the temperature instead of using an external source of heat. After the resistance is measured, the tabs can be etched or otherwise removed at the same time the metallization layer is trimmed, resulting in the embodiment shown in FIG. 6. FIGS. 5 and 6 also illustrate an embodiment where the resistor material 516 is patterned (and extends to dashed lines 517) prior to application of the metallization layer so as to be situated only in the area of the fabricated resistor.

Figure 7:
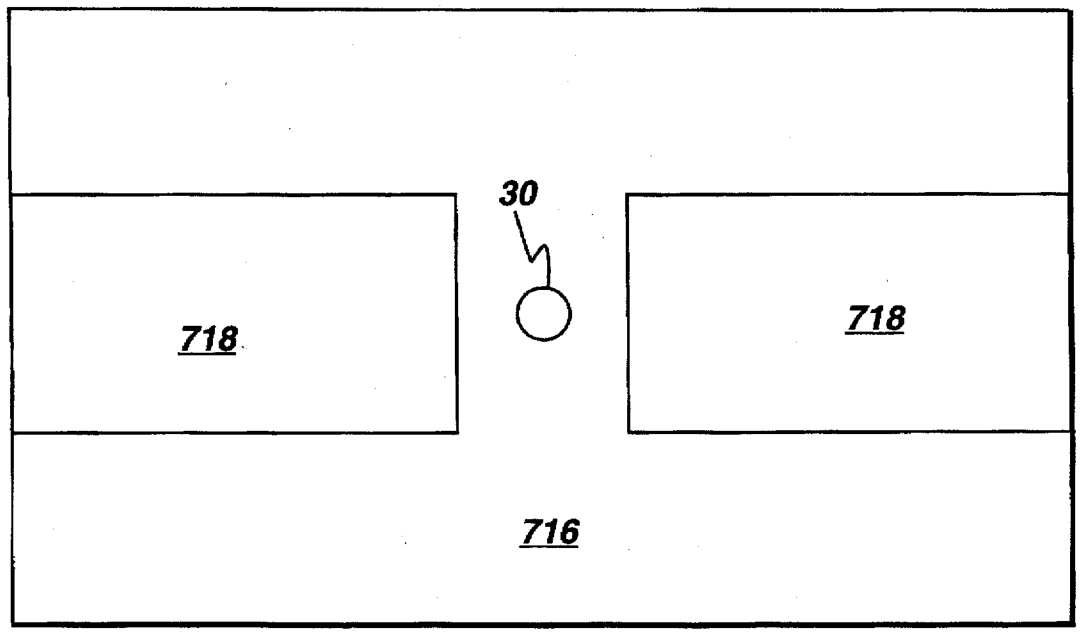
FIG. 7 is a view similar to that of FIG. 3, further showing a probe position on the resistor material.

In still another embodiment, FIG. 7 is a view similar to that of FIG. 4 showing a probe position 30 on the resistor material 716. In this embodiment, as further described in aforementioned R. J. Wojnarowski et al., U.S. application Ser. No. 08/349,278, instead of measuring the resistance value with offset pads as discussed with respect to FIG. 5, either a portion or the entire layer of resistor material can characterized by determining resistance at either one or more probe position characterization points 30, respectively. Preferably a four point probe such as one manufactured by Cerprobe Corp., of Westboro, Mass., is used at each characterization point. A computer algorithm can be used to predict the resistance properties in the area between the metallization layer portions.

After the determination of resistance is made, the metallization layer is further patterned, as necessary. As described in aforementioned R. J. Wojnarowski et al., U.S. application Ser. No. 08/349,270, prior to patterning, the determined resistance value is supplied to a computer algorithm which indicates the precise dimensions for trimming. A photolithographic step is then done to expose segments of the metallization layer for resistor trimming. A chemical etching procedure is used to pattern the resistors, as discussed above. After the etching of the adaptive trim material, the photoresist is removed and the resistor is ready for use.

EXAMPLE

In one experiment, KAPTON-E polyimide (dielectric layer 14) was laminated on a ceramic substrate (substrate 10) using ULTEM polyetherimide (adhesive layer 12) at a temperature of 310° C. Then the KAPTON-E polyimide was subjected to a plasma ash of 80% $O_2$/20% $CF_4$ at a temperature of 120° C. for two minutes to clean the surface. The plasma ash was followed by a high pressure de-ionized (DI) water scrub and a ten minute bake at a temperature of 100° C. to remove remaining water from the KAPTON-E polyimide.

The substrate was then positioned in a vacuum chamber which was pumped down to less than $1\times10^{-6}$ torr. The KAPTON-E polyimide was subjected to an argon backsputter at a power of 400 watts for one minute. $Ta_2N$ was deposited in the vacuum chamber without the substrate for a one minute power ramp-up, and the substrate was then moved under the sputterer where the thin film resistor material 16 of $Ta_2N$ was sputtered on the KAPTON-E polyimide at 5 millitorr and 400 watts for three minutes. The gas mixture was 15% $N_2$ (flow rate of 4.4 sccm—standard cubic centimeters per minute) and 85% argon (25 sccm). The conditions provided a close packed (HCP) $Ta_2N$ phase which has a low temperature coefficient of resistance (TCR) and optimum resistivity of 200–300 micro-ohm cm.

The initial portion of metallization layer 18 was deposited in the same vacuum chamber without altering the vacuum conditions, and 1000 Å of titanium and 2500 Å of copper were sequentially deposited using 400 watts for two minutes and 200 watts for two minutes, respectively. The copper surface was then pre-cleaned with Neutraclean cleaning solution (Neutraclean is a trademark of Shipley Co., Inc., Newton, Mass.) at room temperature for 40 seconds, followed by a rinse. The copper surface was electroplated with additional copper until a thickness of 4 micrometers was obtained. After another argon backsputtering step, titanium was sputtered on the electroplated copper surface at 400 watts for two minutes with a pressure of 1.5 millitorr.

The patterning was next done in several stages. First, 18 microns of negative photoresist was spun on the metallization layer at 1800 rpm and baked for ten minutes at a temperature of 100° C. The resist was then exposed with a laser and developed. An alternative technique for exposing the resist is to use ultraviolet (UV) light. The metallization was patterned by etching the top titanium layer with a dilute hydrofluoric acid solution, etching the copper layer with a dilute $FeCl_3$ solution, and etching the bottom titanium layer with the dilute hydrofluoric acid solution. The first photoresist was then removed and a second layer of photoresist was applied and developed. The $Ta_2N$ material was then etched in a reactive ion etch chamber using 50% $CF_4$ and 50% argon at 450 watts and 5 millitorr for fifteen minutes. After removing the second photoresist layer, the resistor was probed, and the metallization was further trimmed to provide the desired resistor value.

These resistors have demonstrated 0.3 mW/sq. mil (milliwatts per square mil) on a KAPTON polyimide layer having a thickness of about one mil. Thinner KAPTON polyimide surfaces will increase the power densities. This power density is on the order of five to ten times the power density required for termination of analog functions. These resistors have worked without further alternations for more than 3000 hours at twenty times their intended usage in power (500 watts per square inch).

Optimum $Ta_2N$ deposition conditions were determined by X-ray diffraction analysis, resistivity analysis, and thermal coefficient of resistance (TCR) property measurement. A range of 13%–17% $N_2$ gas mixture is preferred, because using significantly more than 15% $N_2$ gas mixture can cause the formation of the face centered cubic (FCC) structure TaN phase instead of the preferred HCP $Ta_2N$ phase. The FCC phase has much higher and more unstable TCR and resistivity than the HCP phase. In contrast, significantly lower than about 15% $N_2$ mixture gas can cause the formation of body centered cubic tantalum (BCC) phase which has lower and also more unstable TCR and resistivity properties than the HCP phase.

As discussed above, the $Ta_2N$ material may require thermal stabilization treatments to reduce the resistance change during usage. Unstabilized material increases its resistance by about eight percent after 100 hours of annealing at a temperature of 200° C. However, when the material was thermal stabilized at a temperature of 250° C. for five hours, there were no changes of resistance at a temperature of 200° C. for up to 200 hours. In the above experiment a separate thermal stabilization process was not performed because another layer of KAPTON polyimide was applied over the metallization layer at a temperature of 200° C. for one hour and sufficient thermal stabilization occurred as a result.

Figure 8:
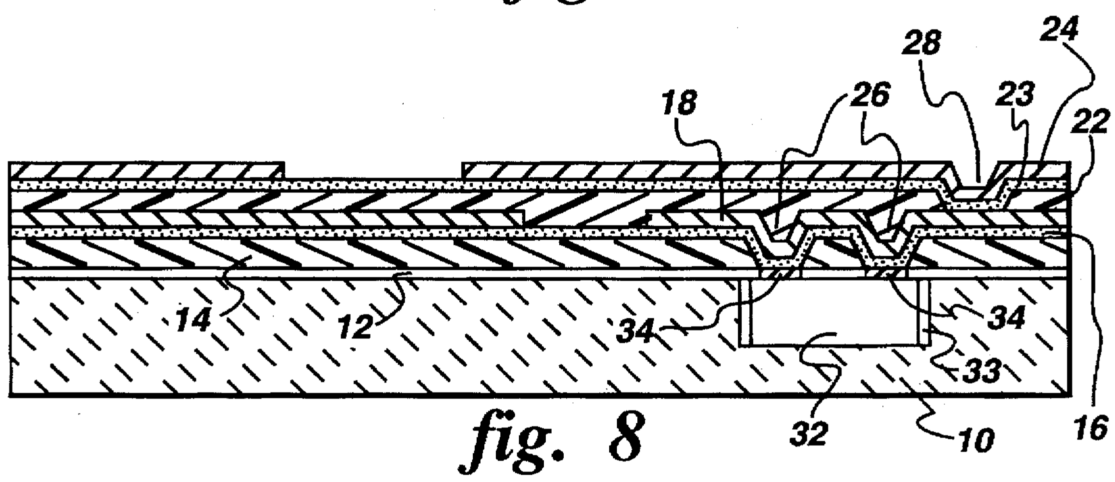
FIG. 8 is a sectional side view showing multi-layer connections of resistors of the present invention to a circuit chip.

FIG. 8 is a view showing multi-layer connections of resistors of the present invention to a circuit chip 32 through vias 26 to chip pads 34. Dielectric layer 14 is applied over a substrate 10 having a chip well 33 with a circuit chip 32 having chip pads 34 situated in the chip well. The circuit chip can be an integrated circuit chip or a discrete circuit component, for example. The chip wells can be either drilled into an alumina substrate or formed during plastic substrate molding or during circuit chip encapsulation in a plastic substrate as described in Fillion et al., U.S. Pat. No. 5,353, 498, issued Oct. 11, 1994.

Preferably the dielectric layer is applied to the substrate before the resistor material is applied. Vias 26 can be formed through the dielectric layer to the chip pads by laser drilling, for example. Next the resistor material is applied, onto the dielectric layer and into the vias followed by the application and patterning of the metallization layer to form a resistor. The metallization layer is patterned so that selected portions of the metallization layer extend in selected ones of vias 26 to couple the resistor to at least one chip pad. The metallization layer can be applied as discussed with respect to FIG. 1.

As shown in FIG. 8, resistors can be fabricated on each level of the MCM technology. The same process steps previously discussed for a single layer can also be used for each upper level dielectric layer. In FIG. 8, a second level resistor material layer 23 overlies a second dielectric layer 22. A second level patterned metallization layer 24 overlies second level resistor material layer 23 and can be coupled to the metallization layer 18 through a via 28 through second level resistor material layer 23 and second level dielectric layer 22.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thin film resistor, comprising:

an organic dielectric layer;

a tantalum nitride layer deposited over the dielectric layer;

a patterned metallization layer over the tantalum nitride layer, a first portion of the metallization layer situated apart from a second portion of the metallization layer with both the first and second portions being at least partially situated on the tantalum nitride layer;

wherein the dielectric layer is situated over a substrate having a chip well with a circuit chip having chip pads situated in the chip well, the dielectric layer having vias to the chip pads, and the tantalum nitride layer and the metallization layer extend into selected ones of the vias.

2. The thin film resistor of claim 1, wherein the tantalum nitride layer comprises a hexagonal closed packed structure.

3. The thin film resistor of claim 2, wherein the dielectric layer comprises a polyimide.

4. The thin film resistor of claim 3, wherein the polyimide includes filler material.

5. The thin film resistor of claim 4, wherein the filler material is one selected from the group consisting of stone and mineral.

6. The thin film resistor of claim 1, further including:

an additional dielectric layer over the metallization layer;

an additional tantalum nitride layer over the additional dielectric layer;

a patterned additional metallization layer (over the additional tantalum nitride layer, a first additional portion of the additional metallization layer situated apart from a second additional portion of the additional metallization layer with both the first and second additional portions being at least partially situated on the additional tantalum nitride layer.

7. A method for fabricating a thin film resistor, comprising the steps of:

applying a dielectric layer over a substrate having a chip well with an integrated circuit chip having chip pads situated in the chip well;

forming vias through the dielectric layer to the chip pads;

applying a tantalum nitride layer over an organic dielectric layer and in selected ones of the vias;

depositing a metallization layer over the tantalum nitride layer and in the selected ones of the vias; and patterning the metallization layer with a first portion of the metallization layer situated apart from a second portion of the metallization layer and both the first and second portions being at least partially situated on the tantalum nitride layer.

8. A circuit module, comprising:

a substrate having a chip well with a circuit chip having chip pads situated in the chip well;

an organic dielectric layer over the substrate and circuit chip, the dielectric layer having vias to the chip pads;

a tantalum nitride layer over the dielectric layer, the tantalum nitride layer comprising a hexagonal closed packed structure and extending into selected ones of the vias; and a patterned metallization layer over the tantalum nitride layer, a first portion of the metallization layer situated apart from a second portion of the metallization layer with both the first and second portions being at least partially situated on the tantalum nitride layer, the metallization layer extending into the selected ones of the vias.

9. The circuit module of claim 8, further including an additional dielectric layer over the metallization layer;

an additional tantalum nitride layer over the additional dielectric layer, the additional tantalum nitride layer and the additional dielectric layer having at least one additional via extending to the metallization layer;

a patterned additional metallization layer over the additional tantalum nitride layer and extending into the at least one additional via, a first additional portion of the additional metallization layer situated apart from a second additional portion of the additional metallization layer with both the first and second additional portions being at least partially situated on the additional tantalum nitride layer.

* * * * *